United States Patent
Schweitzer, III

(10) Patent No.: US 8,675,329 B2
(45) Date of Patent: Mar. 18, 2014

(54) PROTECTIVE DEVICE WITH METERING AND OSCILLOGRAPHY

(71) Applicant: Schweitzer Engineering Laboratories, Inc., Pullman, WA (US)

(72) Inventor: Edmund O Schweitzer, III, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 0 days.

(21) Appl. No.: 13/749,454

(22) Filed: Jan. 24, 2013

(65) Prior Publication Data

US 2013/0135780 A1    May 30, 2013

Related U.S. Application Data

(63) Continuation of application No. 12/562,918, filed on Sep. 18, 2009, now Pat. No. 8,451,572.

(60) Provisional application No. 61/098,636, filed on Sep. 19, 2008.

(51) Int. Cl.
| | |
|---|---|
| H02H 3/00 | (2006.01) |
| H02H 3/10 | (2006.01) |
| H02H 1/00 | (2006.01) |
| G01R 31/02 | (2006.01) |
| G01R 31/12 | (2006.01) |

(52) U.S. Cl.
CPC ............. *H02H 1/0023* (2013.01); *H02H 3/10* (2013.01); *G01R 31/02* (2013.01); *G01R 31/1218* (2013.01)
USPC .......................................................... 361/87

(58) Field of Classification Search
CPC ....... H02H 1/0023; H02H 3/10; G01R 31/02; G01R 21/1218
USPC .......................................................... 361/87
See application file for complete search history.

(56) References Cited

U.S. PATENT DOCUMENTS

| 3,849,786 A | 11/1974 | Nanba |
|---|---|---|
| 4,285,164 A | 8/1981 | Moore |
| 4,369,364 A | 1/1983 | Kuntermann |

(Continued)

FOREIGN PATENT DOCUMENTS

| EP | 0249815 | 12/1987 |
|---|---|---|
| EP | 0818075 | 1/1998 |

(Continued)

OTHER PUBLICATIONS

IEEE 1584, Guide for Performing Arc Flash Hazard Calculations, Industry Applications Society, Sep. 23, 2002.

(Continued)

*Primary Examiner* — Scott Bauer
(74) *Attorney, Agent, or Firm* — Stoel Rives LLP

(57) ABSTRACT

A device, such as an intelligent electronic device (IED), provides a monitoring and protective function for a power system. The protective function uses stimulus acquired from the power system to detect power system conditions and to take one or more protective actions responsive thereto. The device may detect arc flash events in the power system based upon electro-optical and/or current stimulus measurements obtained therefrom. The stimulus measurements may be recorded to use in metering, validation, identifying detector misoperation, and/or event oscillography.

18 Claims, 6 Drawing Sheets

(56) References Cited

U.S. PATENT DOCUMENTS

| | | | |
|---|---|---|---|
| 4,418,338 | A | 11/1983 | Burt |
| 4,422,719 | A | 12/1983 | Orcutt |
| 4,516,022 | A | 5/1985 | Lindgren |
| 4,614,868 | A | 9/1986 | Alster |
| 4,702,553 | A | 10/1987 | Buchmuller |
| 4,791,518 | A | 12/1988 | Fisher |
| 4,878,144 | A | 10/1989 | Nebon |
| 4,978,863 | A | 12/1990 | Lyons |
| 5,170,050 | A | 12/1992 | Giboulet |
| 5,208,542 | A | 5/1993 | Tennies |
| 5,682,101 | A | 10/1997 | Brooks |
| 5,771,091 | A | 6/1998 | Paritsky |
| 5,940,547 | A | 8/1999 | Schumacher |
| 6,011,480 | A | 1/2000 | Schweitzer |
| 6,124,706 | A | 9/2000 | Woods |
| 6,229,680 | B1 | 5/2001 | Shea |
| 6,292,105 | B1 | 9/2001 | Land |
| 6,433,976 | B1 | 8/2002 | Phillips |
| 6,476,396 | B1 | 11/2002 | Forsyth |
| 6,693,438 | B2 | 2/2004 | Shea |
| 6,920,028 | B2 | 7/2005 | Schweitzer |
| 7,035,068 | B2 | 4/2006 | Shea |
| 7,397,596 | B2 | 7/2008 | Yacoubian |
| 7,526,393 | B2 * | 4/2009 | Thurmond et al. ............ 702/60 |
| 7,536,914 | B2 | 5/2009 | Land |
| 7,580,232 | B2 | 8/2009 | Caggiano |
| 7,791,846 | B2 | 9/2010 | Roscoe |
| 7,952,360 | B2 | 5/2011 | Ganesh |
| 8,154,730 | B2 | 4/2012 | Wu |
| 2003/0205460 | A1 | 11/2003 | Buda |
| 2004/0054921 | A1 | 3/2004 | Land |
| 2004/0125532 | A1 | 7/2004 | Schweitzer |
| 2005/0203672 | A1 | 9/2005 | Restrepo |
| 2006/0261259 | A1 | 11/2006 | Beinhocker |
| 2007/0014060 | A1 | 1/2007 | Land |
| 2007/0070568 | A1 | 3/2007 | Potter |
| 2007/0108986 | A1 | 5/2007 | Moore |
| 2007/0132458 | A1 | 6/2007 | Allen, Jr. |
| 2007/0242402 | A1 | 10/2007 | Papallo |
| 2008/0004853 | A1 | 1/2008 | Radibratovic |
| 2008/0094612 | A1 | 4/2008 | Land |
| 2008/0170344 | A1 | 7/2008 | Byron |
| 2008/0239592 | A1 | 10/2008 | Roscoe |
| 2009/0161272 | A1 | 6/2009 | Asokan |
| 2009/0189615 | A1 | 7/2009 | Kinsel |
| 2010/0026425 | A1 | 2/2010 | Roscoe |
| 2012/0002195 | A1 | 1/2012 | Wu |

FOREIGN PATENT DOCUMENTS

| | | |
|---|---|---|
| EP | 1646119 | 4/2006 |
| WO | 8808217 | 10/1998 |
| WO | 0221657 | 3/2002 |

OTHER PUBLICATIONS

IEEE 1584a, IEEE Guide for Performing Arc-Flash Hazard Calculations—Amendment 1, IEEE Industry Applications Society, Nov. 29, 2004.

PCT/US2009/057531 Patent Cooperation Treaty, International Search Report and Written Opinion of the International Searching Authority, Nov. 19, 2009.

VAMP Arc Protection Series, VAMP 121, VAMP 221, Jun. 24, 2008.

UTU Arc Protection Systems—a possibility to be protected, Feb. 27, 2002.

George Roscoe, Marcelo E. Valdes, Ray Luna, Methdos for Arc-Flash Detection in Electrical Equipment, Petroleum and Chemical Industry Conference, 2010 Record of Conference Papers Industry Applications Society, Sep. 20-22, 2010.

PCT/US2009/057520 Patent Cooperation Treaty, International Search Report and Written Opinion of the International Searching Authority, Nov. 19, 2009.

PCT/US2009/057536 Patent Cooperation Treaty, International Search Report and Written Opinion of the International Searching Authority, Nov. 19, 2009.

PCT/US2009/057541 Patent Cooperation Treaty, International Search Report and Written Opinion of the International Searching Authority, Nov. 10, 2009.

PCT/US2009/057548 Patent Cooperation Treaty, International Search Report and Written Opinion of the International Searching Authority, Dec. 3, 2009.

Kevin Lippert, Donald M. Colaberardino, Clive W. Kimblin, Understanding IEEE 1584 Arc Flash Calculations, IEEE Industry Applications Magazine, May 2005.

ABB, Arc Protection Relay, Product Guide Rea 10_, Jun. 22, 2005.

ABB, Arc Protection System REA, Jun. 2005.

Robert Wilson, Rainer Harju, Juha Keisala, Sethuraman Ganesan, Tripping with the Speed of Light: Arc Flash Protection, Mar. 27, 2007.

Meyle, LBW21 Arc Detection System Operating Instruction, Dec. 2004.

European Search Report, Aug. 5, 2013 for European Patent Application 09815287.9.

European Search Report, Aug. 5, 2013 for European Patent Application 09815298.6.

European Search Report, Jul. 2, 2013 for European Patent Application 09815295.2.

* cited by examiner

PROTECTIVE DEVICE WITH METERING AND OSCILLOGRAPHY

CROSS-REFERENCE TO RELATED APPLICATIONS

This application is a continuation of U.S. patent application Ser. No. 12/562,918 to Schweitzer III, Edmund O., entitled, "PROTECTIVE DEVICE WITH METERING AND OSCILLOGRAPHY," filed Mar. 25, 2012, and which claims the benefit under 35 U.S.C §119(e) of U.S. Provisional Patent Application Ser. No. 61/098,636, entitled "Light Detecting Protective Device with Metering and Oscillography," which was filed Sep. 19, 2008, each of which is hereby incorporated by reference in its entirety.

TECHNICAL FIELD

This disclosure relates to power system monitoring and protection and, in particular, to oscillography and metering of power system stimuli.

BRIEF DESCRIPTION OF THE DRAWINGS

The accompanying drawings illustrate various exemplary embodiments of the present system and method and are a part of the specification. Together with the following description, the drawings demonstrate and explain the principles of the present system and method. The illustrated embodiments are examples of the present system and method and do not limit the scope thereof.

DETAILED DESCRIPTION

Figure 1A:
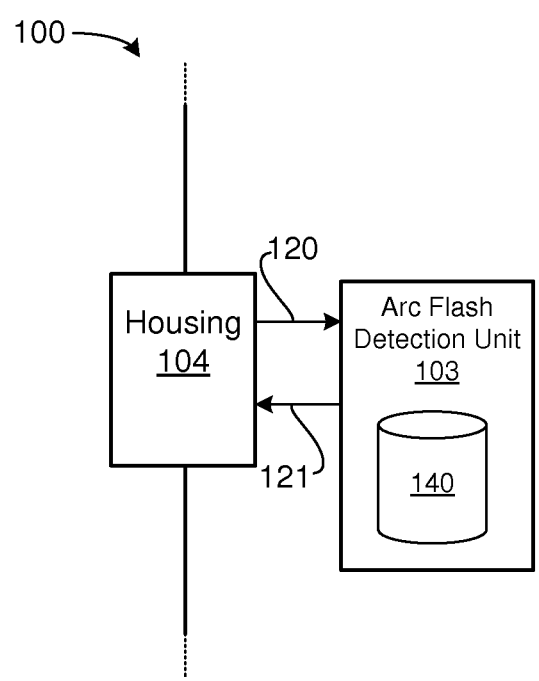
FIG. 1A is a diagram of a power system comprising an arc flash detection unit.

Arc flashes pose a serious risk to both personnel and equipment in the vicinity of a flash. An arc flash may produce intense electro-optical (EO) radiation (including visible light) in the area of the arc. In addition, an overcurrent condition may be created on electric conductor(s) that feed the arc.

An arc flash detection unit (AFDU) may be configured to monitor a portion of a power system (e.g., an enclosure, housing, or the like). The AFDU may be configured to detect an arc flash event based on stimulus received from the power system. The AFDU may make use of various different types of stimulus including, but not limited to: EO radiation detected in the vicinity of the power system, current levels within the power system, voltage levels at various points within the power system, heat, chemical detection, pressure differentials (e.g., sound), detection of particulates within an enclosure, or the like.

The time required to detect an arc flash event by a protection system (e.g., an AFDU) may be used to determine a total time required to clear the arc flash (e.g., the total time required to clear the arc flash may be a sum of the time required to detect the flash plus the time required to trip protective elements responsive to the detection). The time required to clear the arc flash may be referred to as a "total arcing time," which may be used to calculate the incident energy released by the arc flash event (given the arc current, resistance, conductor gap, and the like). The detection time of an arc flash protection system may vary depending upon the configuration of the protection system (e.g., the sensitivity of the system). System sensitivity may be selected to provide a balance between providing adequate arc flash protection and preventing misoperation (e.g., detecting false positives).

The "Guide for Performing Arc Flash Hazard Calculations," which is promulgated by the Institute of Electrical and Electronics Engineers (IEEE) as IEEE 1584, provides several means for calculating arc flash incident energy, one of which is provided below in Equation 1:

$$\text{Log}(E_N) = K_1 + K_2 + 1.0811 \cdot \text{Log}(I_a) + 0.0011 \cdot G \qquad \text{Eq. 1}$$

In Equation 1, $E_N$ is the arc flash incident energy, $K_1$ is a switchgear-dependent constant value (depending upon whether the switchgear is in an open or box configuration), $K_2$ is a constant (0 for ungrounded or high-resistance grounded switchgear and −0.113 for grounded systems), $I_a$ is the maximum arcing current, and G is a gap between conductors within the switchgear.

The IEEE 1584 standard further provides means for determining an arc-protection boundary as follows:

$$D_b = \left[ 4.184 \cdot C_f \cdot E_n \cdot \left(\frac{t}{0.2}\right) \cdot \left(\frac{610^x}{E_b}\right) \right]^{\frac{1}{x}} \qquad \text{Eq. 2}$$

In Equation 2, $D_b$ is the distance of the boundary from the arcing point, $C_f$ is a voltage constant (1.0 for voltages above 1 kV), $E_n$ is the normalized arc flash incident energy (e.g., calculated per Equation 1 above), $E_b$ is the incident energy at the boundary (5.0 J/cm² for bare skin), and x is a distance exponent constant (0.973 for 5 kV switchgear).

The protection boundary may determine where maintenance personnel may safely work in relation to the switchgear and/or may determine what, if any, protective gear should be used by the personnel.

Other standards exist for calculating arc flash energy to determine appropriate proximity and/or protective gear requirements. For instance, the National Fire Protection Association (NFPA) provides for the calculation of an arc thermal performance value (ATPV), which is similar to the IEEE 1584 arc flash incident energy. The ATPV may determine a proximity boundary in which maintenance personnel may safely work. In addition, the ATPV and proximity boundary may indicate the nature of the protective gear that should be used by personnel. Other arc flash safety-related standards are provided by the National Electric Code (NEC) and Occupational Safety and Health Administration (OSHA).

FIG. 1A shows one embodiment of an AFDU 103 in an electrical power system 100. The AFDU 103 may be communicatively coupled to portions of the power system 100 to receive stimulus 120 therefrom. As will be discussed below, the AFDU 103 may be configured to detect an arc flash event occurring within the power system 100 (e.g., within a housing 104) based on the stimulus 120. The stimulus 120 may include current measurements, EO radiation measurements, and the like.

In some embodiments, the AFDU 103 may be communicatively coupled to one or more current transformers, or other measurement devices, configured to provide the AFDU 103 with stimulus 120 comprising current measurements from various points within the power system 100 (e.g., on either side of a housing 104 in the electrical power system 100). The housing 104 may include components that may be susceptible to arc flash events (e.g., switchgear, circuit breakers, and the like).

The AFDU 103 may be configured to receive other types of stimulus 120, such as measurements of EO radiation detected by one or more EO radiation collectors disposed within the vicinity of the power system 100. The EO radiation collectors may be disposed within the housing 104 and/or may be positioned to capture EO radiation produced by an arc flash event. In some embodiments, the EO radiation collectors may be positioned within a switchgear enclosure 105 within the housing 104.

Although particular types of stimulus 120 are discussed herein (e.g., current and EO stimulus), the AFDU 103 could be configured to detect an arc flash event based on any number of different types of stimulus 120. Therefore, this disclosure should not be read as limited in this regard.

The AFDU 103 may be configured to invoke certain protective functions upon detecting an arc flash event. The protective function may be invoked via a communications interface 121 with the power system 100 (e.g., with power system components within the housing 104). For example, the AFDU 103 may trigger a circuit breaker, a switch, or other equipment to remove an arcing circuit from power and/or isolate the circuit from the rest of the power system 100. Alternatively, or in addition, the AFDU 103 may produce an alarm signal that may be received by another protective system (e.g., a protective relay, an IED, or the like), which may be configured to take one or more protective actions responsive to the alarm. The alarm may be transmitted to other remote devices and/or may be made available for display on a human-machine interface (HMI). These protective actions may reduce the amount of energy released by the arc flash event and/or may alert other systems and/or personnel to the arc flash event.

The AFDU 103 may comprise and/or be communicatively coupled to a data store 140, which may comprise computer-readable storage media, such as hard discs, Flash memory, optical storage media, tape media, and the like. The AFDU 103 may store reporting and/or monitoring information in the data store. In some embodiments, the AFDU 103 may be configured to store quantized analog measurements of the stimulus 120 received from the power system. Upon detecting an arc flash event, a report may be generated and stored in the data store 140. The report may include the stimulus 120 that caused the AFDU 103 to detect the arc flash event, may include a record of the protective actions taken by the AFDU (or other protective devices), may include the messages transmitted and/or received via the communications interface 121, may include a response time of various protective devices within the power system (e.g., the response time of breakers, etc.), and the like.

Figure 1B:
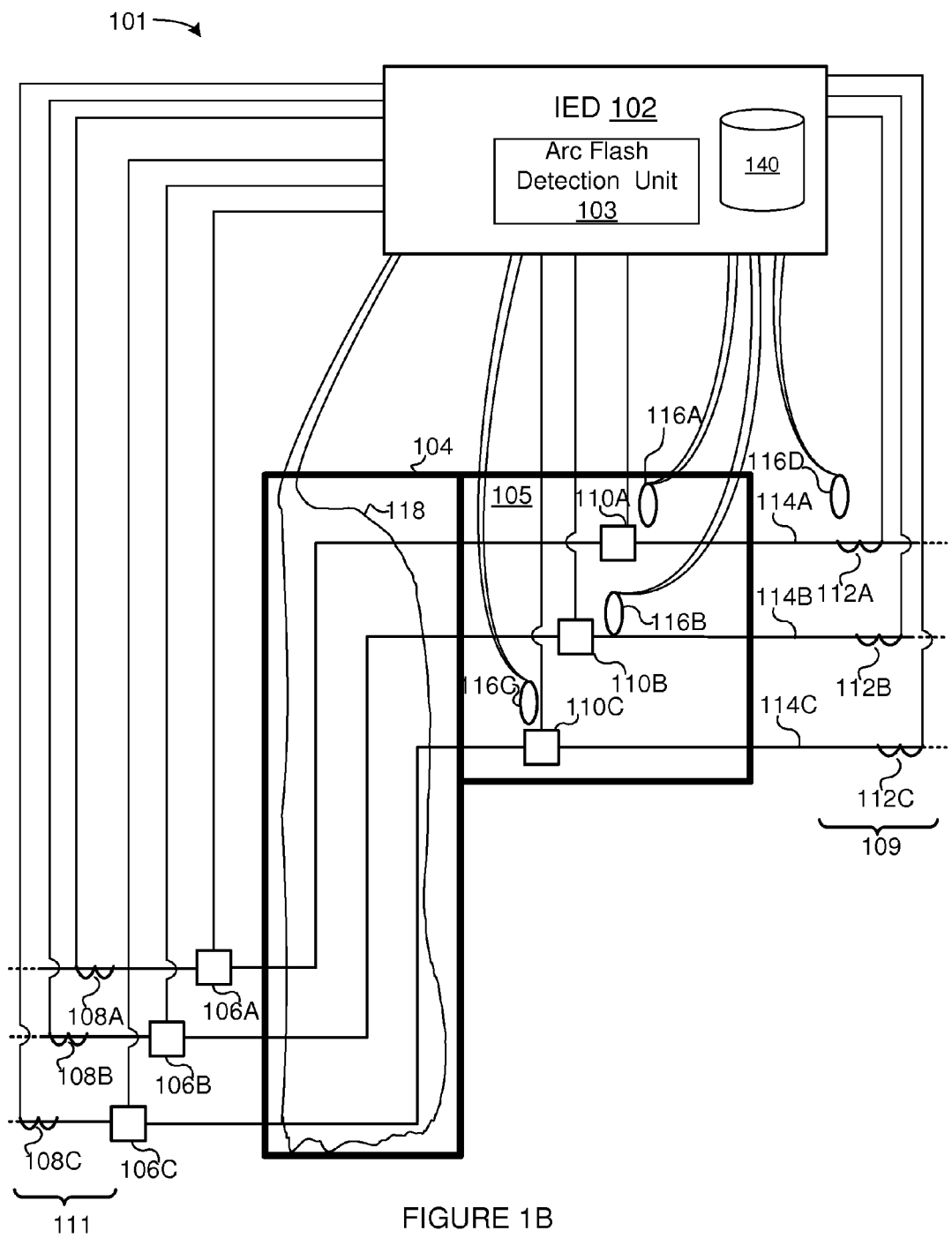
FIG. 1B is a diagram of a power system comprising an intelligent electronic device and an arc flash detection unit.

FIG. 1B shows an electrical power system 101 that includes an intelligent electronic device (IED) 102 comprising an AFDU 103. The IED 102 may provide various monitoring and protection services to the power system 101, including electrical power system components within a housing 104.

As used herein, an IED (such as the IED 102 of FIG. 1) may refer to any one or combination of: a CPU-based relay and/or protective relay, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a Programmable Automation Controller (PAC), a Programmable Logic Controller (PLC), a dedicated arc flash protection controller (e.g., an AFDU), a system integrity protection scheme, or any other device capable of monitoring and/or protecting an electrical power system. Accordingly, the IED 102 may comprise one or more processors, memories, computer-readable storage media, communications interfaces, HMI components, and the like. In the FIG. 1B embodiment, the IED 102 may be a protective relay, such as the SEL 751 manufactured by and available from Schweitzer Engineering Laboratories, Inc. of Pullman, Wash.

As shown in FIG. 1B, the AFDU 103 may be implemented within the IED 102 (e.g., as a component of the IED 102). The AFDU 103 may be implemented as machine-readable and/or machine-interpretable instructions stored on a computer-readable storage media of the IED 102. Alternatively, or in addition, the AFDU 103 may comprise one or more hardware components. In some embodiments, the AFDU 103 (or portions thereof) may be implemented independently of an IED 102 (e.g., the AFDU 103 may comprise its own independent processing resources, communications interfaces, etc.).

The IED 102 and/or AFDU 103 may be configured to monitor power system equipment disposed within the housing 104. The housing 104 may comprise a switchgear cabinet, a sealed enclosure, or any other housing type. The housing 104 may enclose switchgear equipment, such as circuit breakers 110A, 110B, and/or 110C, and the like.

The AFDU 103 may receive various types of stimulus 120 from the power system 101. The stimulus 120 may be received directly (e.g., by sensors coupled to the AFDU 103) and/or indirectly through another device, such as the IED 102. In the FIG. 1B example, the AFDU 103 is configured to receive current stimulus (current measurements obtained by current transformers) and EO stimulus (EO radiation captured by EO radiation collectors). The AFDU 103 may be configured to detect an arc flash event based on the current and EO stimulus 120. However, in alternative embodiments, the AFDU 103 may be configured to detect arc flash events using other stimulus types (e.g., EO radiation and/or current measurements alone, heat, pressure, chemical emissions, etc.).

The AFDU 103 may be configured to monitor a three-phase power signal comprising three conductors 114A, 114B, and 114C, each of which may run through the housing 104 (one for each phase of the three-phase power signal). For instance, the conductor 114A may carry an "A phase" electrical power signal, the conductor 114B may carry a "B phase" electrical power signal, and the conductor 114C may carry a "C phase" electrical power signal. Although a three-phase power signal is referred to herein, one skilled in the art will recognize that the teachings of this disclosure could be applied to power systems comprising any type and/or number of power signals, and, as such, the teachings of the disclosure should not be read as limited in this regard.

In the FIG. 1B example, the AFDU 103 receives current measurements from current transformers (CTs) communicatively and/or electrically coupled to the conductors 114A, 114B, and/or 114C; CTs 112A, 112B, and 112C are coupled to the conductors 114A, 114B, and 114C at a first location 109, and CTs 108A, 108B, and 108C are coupled to the conductors 114A, 114B, and 114C at a second location 111 (e.g., on an opposite end of the housing 104).

The AFDU 103 is communicatively coupled to EO radiation collectors 116A, 116B, 116C, 116D, and 118, which may be configured to detect EO radiation emitted within the vicinity of the housing 104. As used herein, an EO radiation collector, such as the point EO radiation collectors 116A, 116B, and 116C, and 116D and/or the loop 118, may be configured to capture various types of EO radiation including visible EO radiation (e.g., visible light), infra-red (IR) radiation, ultra-violet (UV) radiation, and/or EO radiation at other wavelengths. Moreover, as used herein, light or a "light event" may refer to EO radiation that comprises EO energy at many different wavelengths, some of which may be visible to the human eye and some of which may not. Therefore, this disclosure should not be read as limited to detection and/or processing of only EO radiation visible to humans, but should be read as encompassing any type of EO radiation known in the art.

The EO radiation collectors 116A, 116B, 116C, 116D, and 118 may be distributed within the housing 104 and may be communicatively and/or electro-optically coupled to the IED 102 and/or AFDU 103. In some embodiments, the detectors 116A, 116B, 116C and/or 116D may be "point detectors," comprising fiber-optic leads (or other EO conductive material) configured to selectively detect EO radiation within the housing 104 (e.g., detect EO radiation at particular points and/or locations within the housing 104). The point detectors 116A, 116B, 116C, and/or 116D may be placed and/or positioned within the housing 104 so as to be capable of collecting EO radiation produced by an arc flash event therein (e.g., in the vicinity of the switchgear components, such as the circuit breakers 110A, 110B, and/or 110C, a breaker trunk compartment (not shown), or the like). For example, the point detectors 116A, 116B, 116C, and/or 116D may be positioned to have a line-of-sight and/or an electro-optical path to respective breakers 110A, 110B, and/or 110C (e.g., to avoid "shadows" or other obscuring structures within the housing 104). In some embodiments, the point detectors 116A, 116B, 116C, and/or 116D may be optically coupled to additional optical elements (not shown), such as mirrors, fiber-optic leads, lenses, EO conductive materials, or the like, which may be configured to direct EO radiation produced within the housing 104 and/or in the vicinity of the switchgear components (e.g., breakers 110A, 110B, and/or 110C) to one or more of the detectors 116A, 116B, 116C, and/or 116D.

The detectors 116A, 116B, 116C, and/or 116D may comprise EO conductive materials, such as fiber-optic filaments, capable of collecting EO radiation and transmitting a portion thereof to the IED 102 and/or AFDU 103. Alternatively, or in addition, the EO radiation collectors 116A, 116B, 116C, 116D may be capable of collecting EO radiation and transmitting an electrical signal and/or other indicator of the detected EO radiation to the IED 102 and/or AFDU 103 (e.g., via a communication network or the like).

The AFDU 103 may be coupled to other devices capable of collecting EO radiation, such as the loop EO radiation collector 118, which may extend through a portion of the housing 104. The loop EO radiation collector 118 may comprise one or more sheathed fiber-optic cables (or other EO conductive material), wherein portions of the cable are exposed (e.g., portions of sheathing around the EO conductive material are removed). The loop EO radiation collector 118 may be configured to receive EO radiation through these exposed portions. The EO radiation so received may be transmitted to the IED 102 and/or AFDU 103. Alternatively, or in addition, the loop EO radiation collector 118 may comprise a dedicated EO radiation collector (not shown), which may transmit an electrical signal or other indicator of the EO radiation detected thereby (e.g., via a communication network or the like).

Although FIG. 1B depicts the AFDU 103 receiving EO stimulus from a particular set of EO radiation collectors 116A, 116B, 116C, 116D, and 118, one skilled in the art will recognize that the teachings of this disclosure could be applied to any number and/or type of EO radiation collectors, including, but not limited to: Charge-Coupled Device (CCD) detectors, IR detectors, or the like. Therefore, this disclosure should not be read as limited to any particular number, type, and/or arrangement of EO radiation collectors. Moreover, although a particular housing 104 is depicted, the disclosure is not limited in this regard; the teachings of this disclosure could be applied to any housing known in the art including, but not limited to: a breaker box, switch box, busbar enclosure, duct, conduit, or other enclosure or housing type.

The AFDU 103 may be configured to detect an arc flash event based on inter alia stimulus received from the CTs 108A, 108B, 108C, 112A, 112B, and 112C and/or EO radiation collectors 116A, 116B, 116C, 116D, and 118. High-levels of EO radiation and/or high current levels may be indicative of an arc flash event occurring within the housing 104. Responsive to the AFDU 103 detecting an arc flash event, the IED 102 may be configured to take one or more protective actions, such as tripping one or more circuit breakers (e.g., breakers 106A, 106B, and/or 106C), removing one or more of the conductors 114A, 114B, and/or 114C from power, transmitting one or more alarm signals to external devices, displaying an alarm on an HMI, or the like.

For example, the IED 102 may be communicatively coupled to the circuit breakers 106A, 106B, 106C via a communication network (e.g., over an Ethernet network, a SCADA network, an IEEE C37.118 network, a wireless network, or the like). Responsive to the AFDU 103 detecting an arc-flash event on one or more of the conductors 114A, 114B, and/or 114C, the IED 102 may be configured to interrupt the power flow thereon.

As discussed above, the IED 102 and/or AFDU 103 may comprise and/or be communicatively coupled to a data store 140. The data store 140 may be used to store monitoring information. For example, the stimulus received before and during the timeframe in which the AFDU 103 detected an arc flash event may be stored on the data store 140. The stimulus may include EO radiation stimulus (EO measurements), current stimulus, or other stimulus types. The stimulus may be ordered and/or time-stamped within the data store 140. The time the AFDU 103 detected an arc flash event may also be recorded, along with information regarding the actions taken by the IED 102 and/or AFDU 103 responsive to the detecting (e.g., breaker trip commands, response times, and the like). Accordingly, the reporting information stored on the data store 140 may allow the state of the power system 101 leading up, during, and following an arc flash event (or false arc flash detection) to be reconstructed.

In some embodiments, the data store 140 may store metering information such as the intensity level of the stimulus received from various detector devices (e.g., the EO radiation collector devices 116A-116D and/or 118). The metering information may aid in determining relevant sensitivity, cut off, and other thresholds used to supervise arc flash detection by the AFDU 103 and/or IED 102.

Figure 2:
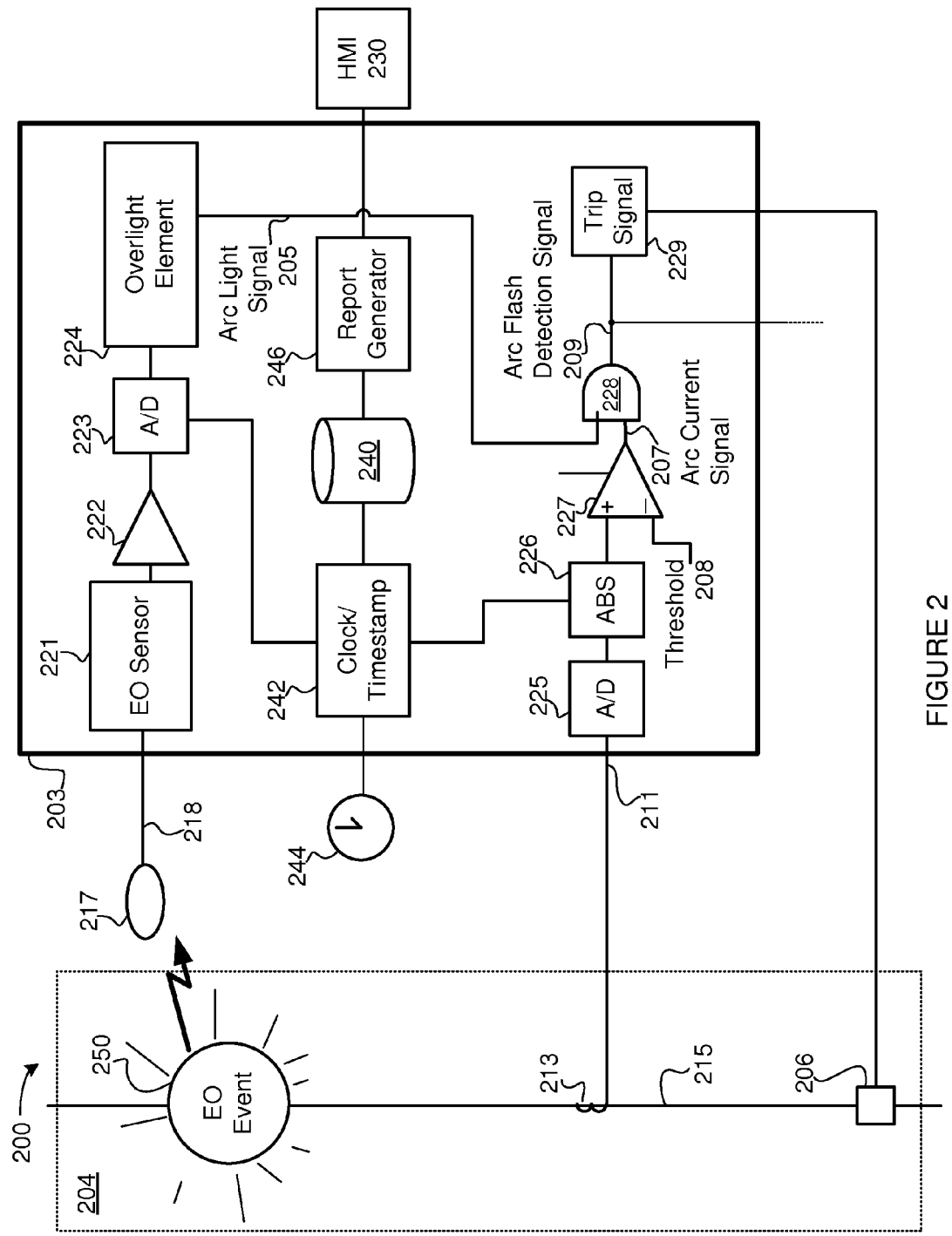
FIG. 2 is a block diagram of one embodiment of a protective device with oscillography.

FIG. 2 depicts a power system 200 comprising an AFDU 203. The AFDU 203 depicted in FIG. 2 may be part of an IED, such as IED 102 depicted in FIG. 1B, and/or may be an independent device (e.g., add-on device), which may be communicatively coupled to an IED or other protective device.

In the FIG. 2 embodiment, the AFDU 203 may monitor a portion of an electrical power system 200, which may comprise a conductor 215 and a circuit breaker 206. The AFDU 203 may receive various types of stimulus from the electrical power system 200. In the FIG. 2 example, the AFDU 203 receives current and EO radiation stimulus 220 via respective detector devices 213 and 217. A CT 213 may be coupled to the conductor 215 to measure a current flowing thereon. The CT 213 may be communicatively coupled to an input 211 of the AFDU 203 to provide current measurement stimulus thereto. An EO radiation collector 217 may be placed in proximity to the conductor 215 and/or within a housing 204 through which the conductor 215 passes. The EO radiation collector 217 may comprise a point EO radiation collector, a loop EO radiation collector, or any other device capable of collecting EO radiation.

An arc flash event occurring in the vicinity of the conductor 215 (e.g., between the conductor 215 and ground, another conductor (not shown), a switch (not shown), on a circuit breaker (not shown), or the like), may produce an EO event 250. The EO event 250 caused by the arc flash may cause EO radiation to be emitted, which may be detected by the EO radiation collector 217. As discussed above, the EO event 250 may produce EO radiation at various frequencies and/or wavelengths, some of which may be visible to a human. The EO radiation collector 217 may be electro-optically coupled to the AFDU 203 to transmit a portion of the EO radiation emitted by the EO event 250 and detected by the EO radiation collector 217 to the EO sensor 221 of the AFDU 203.

The EO sensor 221 may be configured to convert EO radiation received from the EO radiation collector 217 into a signal indicative of the EO radiation (e.g., an electrical signal). Accordingly, the EO sensor 221 may comprise a photodiode (such as a silicon photodiode), a photo resistor, a CCD, a complementary metal-oxide-semiconductor (CMOS) device, or any other device or structure capable of converting EO radiation into an electrical signal.

In some embodiments, the signal produced by the EO sensor 221 may be amplified by an amplifier 222. The amplified measurements may be quantized (digitized) by a conversion element. In the FIG. 2 example, the conversion element may comprise an analog-to-digital converter 223, which may be configured to generate a quantized, discrete representation of the analog EO stimulus measurements. The amplifier 222 may comprise a fixed or variable gain amplifier. In alternative embodiments, the amplifier 222 may be omitted.

Although FIG. 2 shows the EO sensor 221, amplifier 222, and A/D converter 223 as part of the AFDU 203, one skilled in the art will recognize that these components could be disposed in proximity to the EO radiation collector 217. In this alternative embodiment, the EO radiation collector 217 may be configured to generate a signal indicative of detected EO radiation (e.g., as a sampled, discrete measurement) using a local EO sensor, amplifier, and/or A/D converter (not shown), and could communicate the measurement(s) to the AFDU 203 via a communication network (not shown) or the like.

The AFDU 203 includes an overlight element 224, which may produce an arc light signal 205 based on the EO measurements received via the EO sensor 221. Assertion of the arc light signal 205 may indicate that the AFDU 203 has detected EO radiation indicative of an arc flash event.

In some embodiments, the overlight element 224 may compare the sampled, discrete EO radiation measurements produced by the A/D converter 223 to an overlight threshold value. The overlight threshold value may represent an EO radiation level that is indicative of an arc flash event (e.g., as opposed to changes in ambient light conditions or the like). The arc light signal 205 may be asserted if the EO radiation level exceeds the threshold. The threshold may be adapted according to a desired sensitivity level of the AFDU 203.

The overlight element 224 may implement other comparison techniques. In some embodiments, the overlight element 224 may implement a time-intensity metric, such as an inverse time-over-stimulus (e.g., inverse time-over-light) metric, a cumulative stimulus metric, or the like. Examples of such comparison techniques are described in co-pending application Ser. No. 12/562,787, filed 18 Sep. 2009, and entitled "Secure Arc Flash Detection," which is hereby incorporated by reference in its entirety.

Assertion of the arc light signal 205 may be indicative of an arc flash event. Therefore, in some embodiments, the AFDU may assert the arc flash detection signal 209 based upon the arc light signal 205 (e.g., bypassing the AND gate 228). In the FIG. 2 example, however, the arc flash detection signal 209 is supervised by an arc current signal 207, which may be asserted based upon current stimulus (e.g., asserted upon detection of an overcurrent condition indicative of an arc flash event as discussed below).

A current input 211 of the AFDU 203 may be configured to receive current measurements acquired by a CT 213. The CT 213 may be communicatively and/or electrically coupled to the conductor 215. Although the AFDU 203 is shown as receiving a single current measurement, the disclosure is not so limited; the AFDU 203 could be adapted to receive any number of current measurements from any number of current transformers.

In some embodiments, the current measurements may be filtered (by a low-pass, band-pass filter, anti-alias filter, a combination of filters, or the like). A quantized analog representation of the measurements may be generated by an A/D converter 225. In addition, in some embodiments, a magnitude of the sampled current measurements may be calculated by an absolute value block 226.

In the FIG. 2 example, the arc current signal 207 may be formed by a comparator 227, which may assert the arc current signal 207 if the current measurements exceed an arc current threshold 208. However, the disclosure is not limited in this regard; any comparison technique known in the art could be used to assert the arc current signal 207. Furthermore, in some embodiments, the arc current signal 207 may be produced using an overcurrent element (not shown), which may implement a cumulative energy comparison technique as described above (e.g., an inverse time-over-stimulus metric, an accumulated stimulus metric, or the like).

The arc light signal 205 and the arc current signal 207 flow to the AND gate 228, the output of which may comprise an arc flash detection signal 209. In some embodiments, the AFDU 203 may further include a security timer (not shown). The security timer may supervise the arc flash detection signal 209, such that the arc flash detection signal 209 is asserted only if the output of the AND gate 228 is asserted for a pre-determined time period and/or for a pre-determined number of measurement cycles.

As discussed above, the arc flash detection signal 209 may cause one or more protective actions to be performed. In some embodiments, the arc flash detection signal 209 may be used to activate one or more protective modules (e.g., protective modules and/or functions of an IED (now shown) upon which the AFDU 203 is implemented). FIG. 2 shows the arc flash detection signal 209 activating a trip signal module 229. The trip signal module 229 may comprise a protective function of a protective device, such as an IED. Assertion of the arc flash detection signal 209 may cause the trip signal module 229 to generate a trip signal to the circuit breaker 206. The circuit breaker 206 may remove the conductor 215 from power, which may clear the arc flash event and minimize the energy released thereby.

The AFDU 203 and/or the trip signal module 229 may be configured to transmit the arc flash detection signal in a particular format and/or using a particular protocol, including, but not limited to: Ethernet, SCADA, IEEE C37.118, SNMP, or the like. As will be appreciated by one of skill in the art, any signaling and/or control mechanism could be used under the teachings of this disclosure.

In some embodiments, the arc flash detection signal 209 may be communicated to an IED or other device configured to monitor and/or protect the power system 200. The AFDU 203 (alone or in conjunction with another device, such as an IED) may be configured to provide other arc flash event monitoring and/or protection mechanisms including, but not limited to: transmitting the arc flash detection signal 209 to an HMI, IED, or other device; tripping additional circuit breakers; diverting power to or from portions of a power system; and the like.

In some embodiments, the AFDU 203 may be configurable. Configuring the AFDU 203 may comprise determining a sensitivity of the overlight element 224, determining the sensitivity of the overcurrent element (not shown) and/or the threshold 208, determining how the arc flash detection signal 209 is formed (e.g., by the arc light signal alone 205, by a combination of the arc light signal 205 and the arc current signal 207, etc.), or the like. The AFDU 203 may receive configuration information via a communications interface (not shown) and/or an HMI 230. In embodiments in which the AFDU 203 is implemented within an IED, the IED (or other computing device) may be configured to provide the 230 HMI or other interface to provide for configuration of the AFDU 203.

As discussed above, the stimulus received by the AFDU 203 may be available in a quantized analog format (from the A/D converters 223 and 225). As used herein, quantized analog data (or "digital analog data") may refer to a digital representation of an analog measurement, such as a digital representation of an EO radiation intensity measurement (e.g., in LUX, lumens or the like), a current measurement (e.g., in amps), or the like. The quantized analog measurements may be of varying resolutions. The A/D converters 223 and 225 may be configured to output discrete measurements of the EO and current stimulus at various different resolutions. In some embodiments, one or more of the A/D converters 223 and/or 225 may be configured to output measurements at high resolution (e.g., to within one hundredth of an amp). In other embodiments, a lower resolution may be used.

The AFDU 203 may include and/or be communicatively coupled to a data store 240, which may include computer-readable storage media, such as disc, Flash memory, optical storage, or the like. During monitoring, the quantized analog measurements output by the A/D converters may be stored in the data store 240. In some embodiments, the stimulus measurements may be stored in the order they are received (e.g., in a first-in first-out (FIFO) data structure, or the like). The ordering may allow the sequence of stimulus leading up to a particular event to be reconstructed (e.g., detection of an arc flash by the AFDU 203). Alternatively, or in addition, the measurements may include respective time stamp information (applied by the clock/timestamp module 242). The information applied by the clock/timestamp module 242 may indicate a time each stimulus measurement was received. The clock/timestamp module 242 may operate on an internal time standard. Alternatively, or in addition, the clock/timestamp module 242 may be coupled to an external time source 244, such as IRIG (via GPS satellites), WWVB, WWB, a local common time source, or the like.

The data store 240 may be configured to record indicators of the arc light signal 205, the arc current signal 207, and/or the arc flash detection signal 209. The signals 205, 207, and/or 209 may include respective time stamps. The data store 240 may include additional information regarding protective actions taken by the AFDU 203, such as the operation of the trip signal module 229, any alarms asserted by the AFDU 203, alerts issued by the AFDU 203, and so on.

The information stored in the data store 240 may be made available to an operator of the AFDU 203 and/or to other devices (e.g., an IED (not shown), other protective devices (not shown) or the like). In the FIG. 2 example, the data store 240 may be coupled to the HMI 230 via a report generator 246, which may be configured to present data stored in the data store 240 to an operator. The report generation module 246 may be configured to retrieve and present stimulus data stored in the data store 240. In some embodiments, the report generator 246 may be further configured to reconstruct a series of stimulus measurements (and responses of the AFDU 203 thereto) over a particular timeframe, such as the time leading up to detection by the AFDU 203 of an arc flash event. The reconstruction may allow an operator (through the HMI 230) to identify the cause of the arc flash detection.

Data may be exported from the data store 240. The exporting may comprise retrieving from the data store 240 a particular sequence of quantized analog stimulus measurements, response information, and the like. The information may be exported within a particular time frame (e.g., stimulus measurements received on May 9, 2008, from 10 AM to 1 PM) and/or leading up to a particular event (e.g., stimulus measurements recorded in the hour leading up to detection of an arc flash event). The exporting may be done through the HMI 230, a communication interface (not shown), an external storage interface (e.g., USB®, Firewire®, or other interface), or the like.

In some embodiments, the report generator 246 may make stimulus measurements available through the HMI 230 in real-time (e.g., as the measurements are received). The real-time stimulus measurements may allow an operator to meter and/or configure the system. For example, a real-time EO radiation measurement at particular times of day may provide an operator an indication of the ambient light conditions within the power system (e.g., as observed by the EO radiation collector 217). The operator may use the metering information to configure the AFDU 203 appropriately (e.g., configure the overlight element 224 with a set of thresholds, inverse time-over-light curve, or the like). Similarly, the real-time measurements may be used in a testing and/or calibration scenario. For example, an operator may cause EO radiation to be emitted in the vicinity of the EO radiation collector 217 and then determine (via the HMI 230) the resulting quantized analog measurements recorded by the AFDU 203. A difference between the intensity of the produced EO radiation and the EO radiation recorded by the AFDU 203 may be used to determine the efficiency (e.g., attenuation) of the EO radiation collector 217 and/or EO conductor cable 218.

The report generator 246 and/or HMI may be configured to display EO radiation stimulus measurements as a quantized analog measurement (e.g., in LUX, lumens, LUX, or the like) and/or on a detector pickup percentage basis. For instance, EO radiation stimulus may be displayed as 6000 LUX and/or, if the pickup of the EO radiation collector 217 and/or EO sensor 221 is approximately 1200 LUX, the display may read 500% or as a pickup value of 5.

Other stimulus types may be similarly displayed. For instance, current stimulus may be displayed in terms of the current magnitude (e.g., on the conductor 215), the current magnitude on the current transformer 213 (e.g., 1250 Amps), and/or a percentage (or per-unit) basis. The current magnitude may be displayed as a root mean square (RMS) value that may be calculated by the report generator 246. The percentage or per-unit basis may be based on the overcurrent threshold 208. Thus, if the current is 80% of the threshold, the display may register a per-unit (or pickup) value of 0.8 for current. Alternatively, or in addition, the stimulus measurements (EO radiation, current, and the like) may be displayed in terms of an energy level represented thereby. Alternatively, or in addition, Equations 1 and 2, discussed above, may be applied to the stimulus data to display an estimated total energy produced by an arc flash event, provide proximity guidelines, protective gear requirements, and the like. Similarly, the EO sensor 221 and/or the AFDU 203 may be configured to estimate an energy represented by the EO radiation stimulus (e.g., by combining a spread spectrum of observed EO radiation, estimating an energy level from the observed EO radiation, properties of the EO radiation collector 217, EO sensor 221, and the like, and so on). The EO and current energy estimates may be used to refine the respective energy estimates, provide cross-validation and/or error checking.

In other embodiments, the data store 240 and/or the report generator module 246 may be configured to record and provide access to other stimulus types, such as voltage measurements, pressure measurements, temperature, chemical, and so on. Accordingly, this disclosure should not be read as limited to recording only EO and/or current stimulus.

The report generation module 246 may have different capacity levels depending upon the monitoring needs and/or configuration of the AFDU 203 (e.g., the frequency of the stimulus measurements, the resolution of the A/D converters 223 and 225, and so on). In some embodiments, the data store 230 may have sufficient capacity to store hours, days, weeks, or months worth of monitoring data. In some embodiments, the data store 240 may be communicatively coupled to a backup storage device (not shown), such as a network attached storage (NAS) device, an external data store (not shown) or the like. The AFDU 203 (through the HMI 230) may be configured to periodically backup and/or offload the contents of the data storage module 240 to the backup storage device to prevent data loss and/or to free up storage space on the data storage module 240 to thereby provide for continuous, uninterrupted recording.

Figure 3:
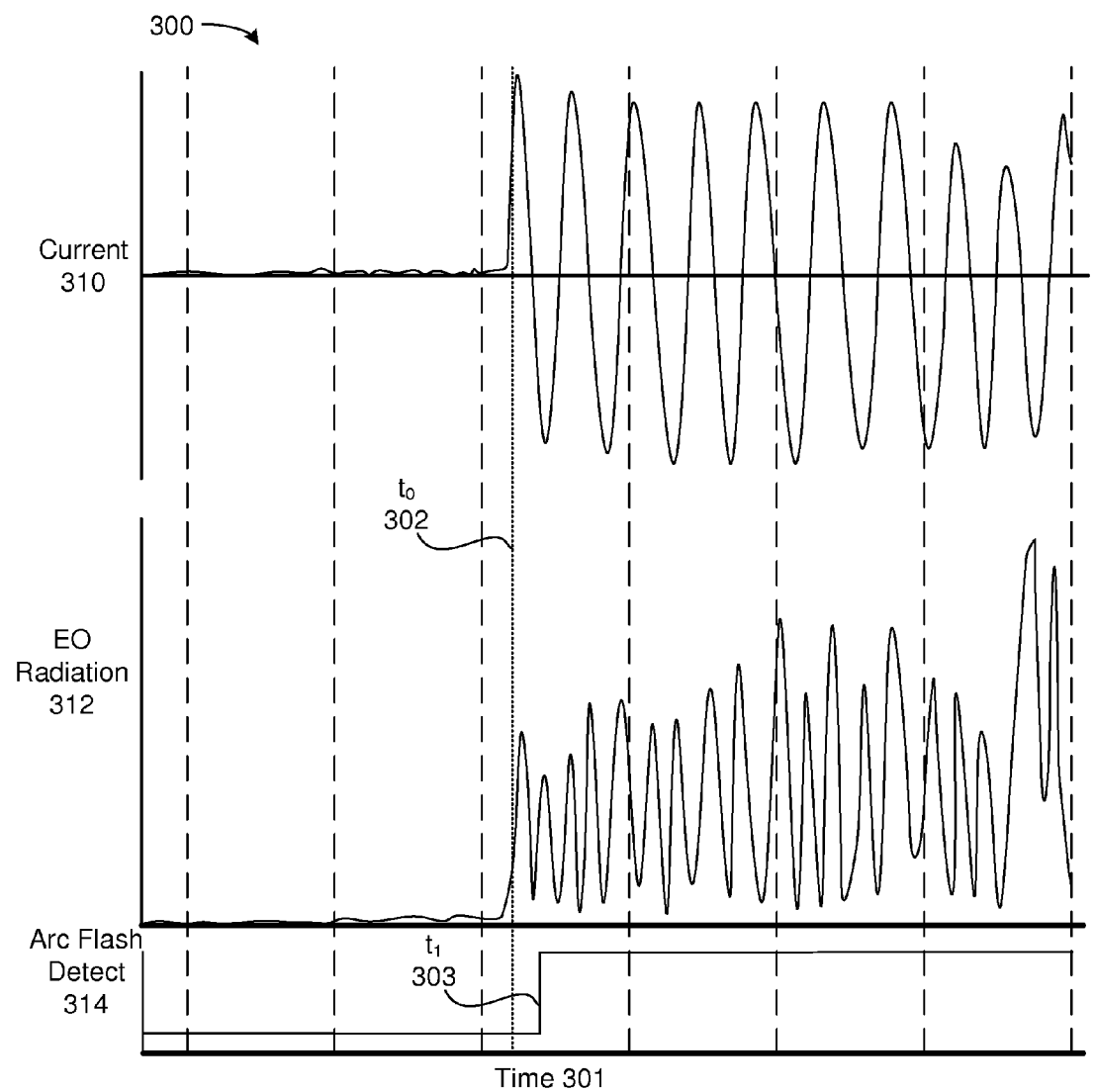
FIG. 3 is an example of a graphical display for oscillography data.

The report generating module 246 and/or the HMI 230 may be configured to display report data in various different ways (e.g., in a table, graphically, or the like). FIG. 3 depicts one example of a graphical display of information recorded on the data store 240 and presented by the report generator 246 via the HMI 230. The display 300 of FIG. 3 includes a plot of stimulus measurements as a function of time. In the FIG. 3 example, the plot 300 depicts quantized analog current stimulus measurements 310 and EO radiation stimulus measurements 312 along a time axis 301. The current stimulus 310 may be displayed in terms of amperes, current transformer pickup, in proportion to an overcurrent threshold, or the like. The EO radiation stimulus 312 may be displayed in terms of lumens, LUX, in terms of a detector pickup value, in proportion to an EO threshold, or the like.

The FIG. 3 example includes an arc flash detection signal 314. The arc flash detection signal 314 may correspond to the arc flash signal 209 of FIG. 2, a breaker trip signal produced by the trip signal generator 229 of FIG. 2, or another signal produced by an AFDU (or IED) responsive to detecting an arc flash event.

As illustrated in FIG. 3, the current 310 and EO radiation 312 stimulus remain relatively low until time $t_0$ 302, at which time an event occurs that causes EO radiation and overcurrent current stimulus to be received. At time $t_1$ 303, an arc flash detection signal is observed. The time difference between $t_0$ 302 and $t_1$ 303 may represent a response time of the AFDU or IED.

Although FIG. 3 depicts a particular set of quantized analog stimulus measurements and an arc flash detection signal 314, the disclosure is not limited in this regard. The graphical display of FIG. 3 could be adapted to include other quantized analog measurements (pressure, voltage, etc.), and/or other response signals (e.g., alarms, tripping signals, or the like). Similarly, the display could be adapted to display the quantized analog stimulus measurements and/or response signals in alternative formats, using alternative interfaces (e.g., graphical, audio, video, etc), and the like.

Figure 4:
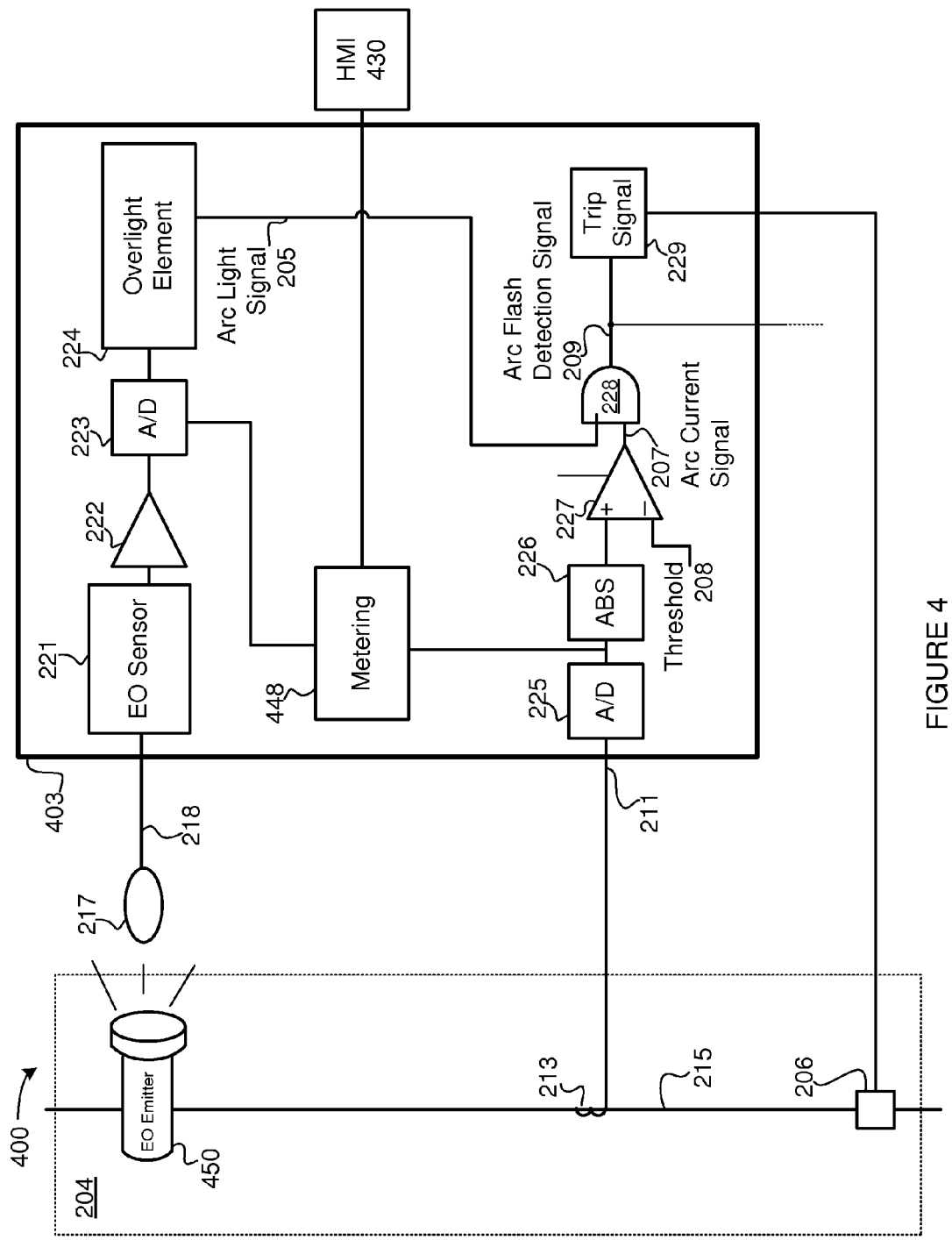
FIG. 4 is a block diagram of one embodiment of a protective device with metering.

FIG. 4 is a block diagram of one embodiment of an IED configured to provide EO radiation metering. The AFDU 403 of FIG. 4 may be implemented in conjunction with and/or separately from an IED, such as the IED 102 of FIG. 1B.

The AFDU 403 may include a metering module 448, which may be communicatively coupled to an HMI 430. The metering module 448 may be configured to receive quantized analog stimulus measurements, including measurements of EO stimulus (received via EO radiation collector 217) and current measurements (received via current input 211). Although not shown in FIG. 4, the quantized analog stimulus measurements may be time stamped (e.g., by a clock/time stamp module (not shown)) and stored on a data store (not shown) for later retrieval and/or display using a report generator module (not shown).

The metering module 448 may make quantized analog stimulus measurements available as they are received (e.g., in real-time). The quantized analog stimulus measurements may be displayed to an operator on the HMI 430 and/or transmitted to other devices and/or operators via a communications interface (not shown). The quantized analog measurement data may be displayed in terms of magnitudes, percentages, per-unit basis, and the like (as described above). The metering module 448 may further provide for the display of signals generated by the AFDU 403 (or other devices) responsive to the stimulus may be displayed, including, but not limited to: the arc light signal 205, the arc current signal, the arc flash detection signal 209, a tripping signal generated by the trip signal module 229, and the like. In some embodiments, the display provided by HMI 430 may further include configuration parameters of the AFDU 403, such as the overcurrent threshold 208, the configuration of the overlight element (e.g., the inverse time-over-light curve), and the like. The HMI 430 may allow an operator to adjust the configuration settings responsive to the metering data (e.g., set the EO and/or overcurrent detection threshold(s) according to ambient lighting conditions and/or nominal operating conditions observed within the power system 400).

In some embodiments, the metering module 448 may be used to calibrate and/or validate the AFDU 403. For example, an EO emitter 450 may be configured to emit EO radiation in the vicinity of the EO radiation collector 217. The EO emitter 450 may be configured to emit EO radiation in the vicinity of switchgear (or other power system components) monitored by the AFDU 403. The EO emitter 450 may be further configured to emit EO radiation from a position within the switchgear, from which EO radiation would likely be emitted in an actual arc flash event. In some embodiments, EO emitter 450 may be controlled by a validation component. Examples of such an EO emitter are disclosed in co-pending application Ser. No. 12/562,197, filed 18 Sep. 2009, and entitled, "Validation of Arc Flash Detection Systems," which is hereby incorporated by reference in its entirety. Alternatively, or in addition, the EO radiation collector 217 may comprise an EO conductor (not shown) capable of transmitting EO radiation into the vicinity of the EO radiation collector 217 (e.g., for use in a self test operation). Examples of such an EO radiation collector are disclosed in co-pending application Ser. No. 12/562,834, filed 18 Sep. 2009, and entitled, "Arc Flash Protection with Self-Test," which is hereby incorporated by reference in its entirety.

The metering module 448 may display and/or cause to be recorded, quantized analog EO radiation measurements received responsive to EO radiation emitted by the EO emitter 450. The measurements may be used to configure, test, and/or validate the operation of the AFDU 403. For example, if no EO radiation is detected by the EO radiation collector 217 and/or transmitted via the EO conductor cable 218 (e.g., no EO radiation is received by the EO sensor 221), it may be determined that there is a problem with the EO radiation collector 217 (e.g., the EO radiation collector 217 is not positioned to receive the EO radiation emitted by the emitter 450, the EO radiation collector 217 is capable of receiving EO radiation, the EO conductor cable 218 is incapable of transmitting EO radiation, or the like).

An attenuation level of the EO radiation collector 217 and/or EO conductor cable 218 may be determined by comparing the intensity of the EO radiation emitted by the EO emitter 450 to the quantized analog EO radiation measurements received at the AFDU 403. A high attenuation level may indicate that the EO radiation collector 217 and/or EO conductor cable 218 have been damaged. For instance, when an EO conductor (such as the EO conductor cable 218 and/or an loop EO radiation collector (described in the co-pending applications incorporated by reference above)) is abraded, it may begin to attenuate EO signals transmitted thereon. The attenuation may become progressively worse, until reaching a point that the EO conductor and/or EO radiation collector are no longer capable of collecting and/or conducting EO radiation to the AFDU 403. Similarly, the detection area of an EO radiation collector may become progressively obscured over time (e.g., by dust, grime, or the like) and/or may be gradually moved out of place (e.g., by vibrations within a switchgear enclosure). The metering of the AFDU 403 using quantized analog measurements as opposed to a binary "on" or "off" indication of EO transmission via the EO radiation collector 217 may allow for detection of this progressive deterioration, which may allow such issues to be addressed before a failure occurs.

The metering module 448 may be used to evaluate the configuration of the AFDU 403. For example, some EO radiation collectors 217 and/or EO conductor cables 218 may inherently attenuate signals transmitted thereon (e.g., a fiber optic cable may attenuate EO radiation at a rate between 0.5 dB/km to 1000 dB/km). The metering module 448 may allow an operator (or other device) to determine the attenuation of a particular AFDU 403 configuration (e.g., using the quantized analog measurements made available by the metering module 448). If the attenuation imposed by the EO radiation collector 217 and/or EO conductor cable 218 is too great, the AFDU 403 may be reconfigured (e.g., to use a shorter EO conductor cable 218, to include an EO repeater (not shown), to incorporate a remote EO sensor (not shown), or the like).

The metering module 448 may also be used to determine an appropriate configuration for the AFDU 403 (e.g., for the threshold 208, the inverse time-over light curve used by the overlight element 224, and the like). For example, an operator may observe the quantized digital signal stimulus measurements made available by the metering module 448 (or the report generator 246 described above) and set configuration of the AFDU 403 accordingly (e.g., to be greater than observed ambient EO radiation levels, nominal current levels, etc.). In embodiments, incorporating a reporting module and/or data store (as in FIG. 2), the operator may observe changes to the ambient stimulus levels over time. For example, the levels of ambient EO radiation levels may change depending upon the orientation of the sun relative to the EO radiation collector 217 (e.g., depending upon the time of day, the season, and the like). Similarly, current levels may change depending upon power demand on the power system (e.g., current levels may be greater during summer afternoons than evenings). The operator may configure the AFDU 403 accordingly (e.g., set thresholds according to the time of day, change the position of detector(s) within the power system, and the like).

The operation of the metering module 448 may be controlled by an operator via the HMI 430 and/or a communications interface. The operator may control the types of quantized analog stimulus measurements displayed via the HMI 430 (e.g., EO radiation, current, etc.), control the manner in which the stimulus measurements are displayed (e.g., select a time scale, measurement factor (e.g., linear, logarithmic, etc.), select the responsive signals to be displayed, select configuration parameters for display (e.g., threshold values, such as the overcurrent threshold 208), and the like.

Figure 5:
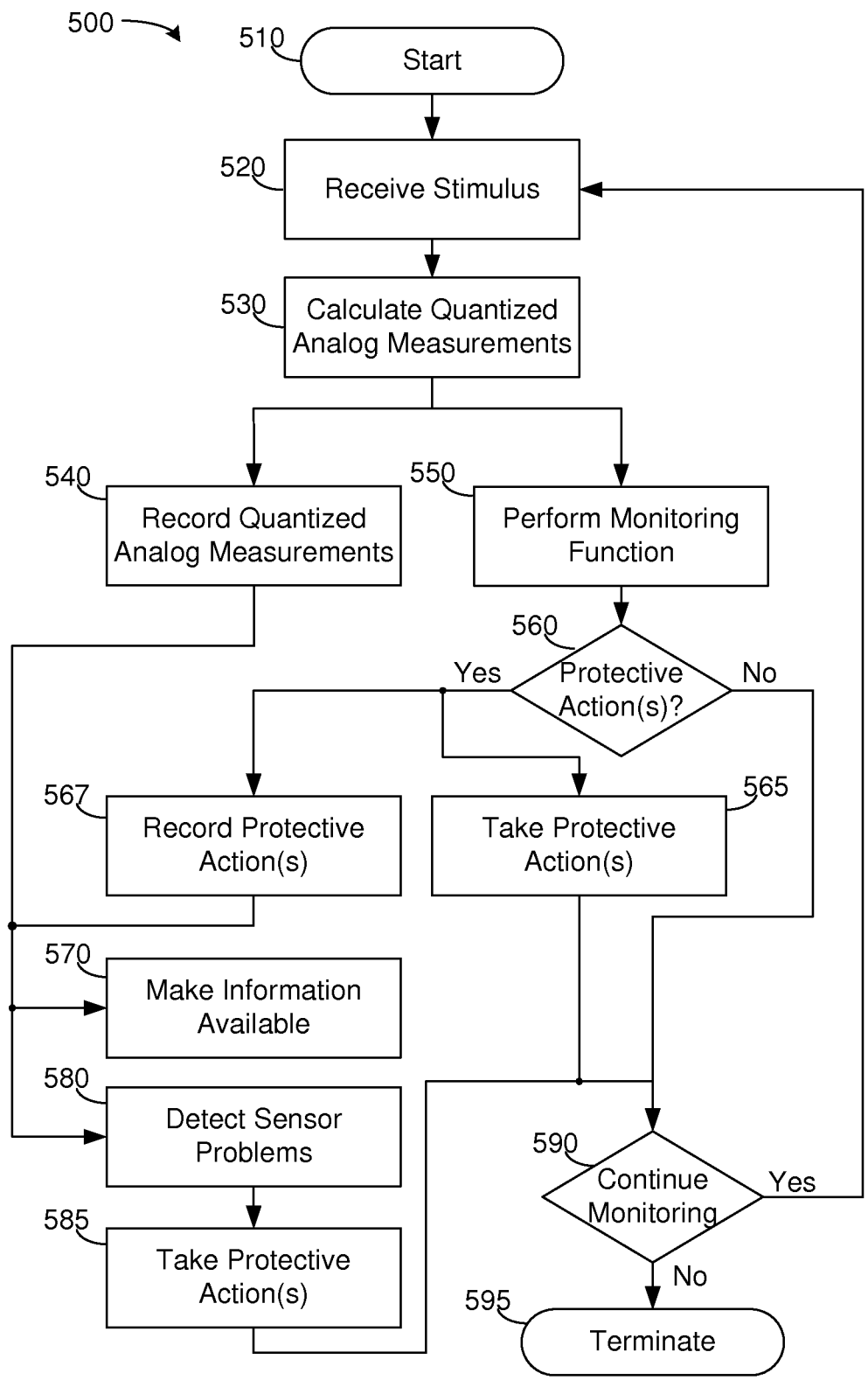
FIG. 5 is a flow diagram of one embodiment of a method for providing protective functions with metering and oscillography.

FIG. 5 is a flow diagram of one embodiment of a method for providing a protective device with metering and oscillography. The method 500 may comprise one or more machine executable instructions stored on a computer-readable storage medium. The instructions may be configured to cause a machine, such as a computing device or IED, to perform the method 500. In some embodiments, the instructions may be embodied as one or more distinct software modules on the storage medium. One or more of the instructions and/or steps of method 500 may interact with one or more hardware components, such as computer-readable storage media, communications interfaces, EO radiation collectors, EO emitters, and the like. Accordingly, one or more of the steps of method 500 may be tied to particular machine components.

At step 510, the method 500 may start and be initialized, which may comprise allocating and/or initializing resources required by the method 500, such as communications interfaces, detector devices, computer-readable storage media, and the like.

At step 520, a sequence of one or more of stimulus measurements may be received. The stimulus measurements may include EO radiation measurements, current measurements, voltage measurements, pressure measurements, or the like. The stimulus measurements received at step 520 may be processed. For example, the stimulus measurements may be filtered to remove harmonic content and/or to isolate particular frequencies and/or frequency ranges. In some embodiments, the processing may include applying one or more compensation parameters to the measurements to account for different detector types and/or detector configurations (e.g., compensate for different orientation and/or winding configurations of different current transformers, different pickup thresholds of various EO radiation collectors, attenuation levels of various transmission media, and the like).

At step 530, quantized analog representations of the stimulus measurements may be obtained. As discussed above, a quantized analog measurement representation may include a digital representation of an analog stimulus measurement. The quantized analog representations may be produced by a conversion element, such as A/D converter or other sampling and/or quantization device.

At step 540, the quantized analog representations may be stored in a computer-readable storage medium. In some embodiments, the storage medium may order the stimulus measurements in time (e.g., in a first-in first-out orientation). Alternatively, or in addition, the quantized analog measurements may be associated with time stamp information, which may indicate a time each of the measurements was received. The time stamp information may be derived from an internal clock (e.g., a clock provided by the method 500). In some embodiments, the clock may be synchronized to an external time source or reference time. The ordering and/or time stamping may allow the stimulus measurements received within a particular internal or timeframe to be reconstructed.

At step 550, and concurrently with step 540, the method 500 may perform a monitoring function using the stimulus measurements. The monitoring function of step 550 may include arc flash detection as described above. At step 560, the method may determine whether any protective actions are to be taken responsive to the monitoring (e.g., determine whether an arc flash event has been detected). If protective actions are to be taken, the flow may continue to step 565; otherwise, the flow may continue to step 590.

At step 565, one or more protective actions may be taken responsive to the monitoring function of step 550. For example, step 565 may include asserting an arc flash detection signal (e.g., asserting the arc flash detection signal 207 discussed above in conjunction with FIGS. 2 and 4). The protective actions of step 565 may further include generating one or more breaker tripping signals, asserting one or more alarms, issuing one or more alerts, or the like.

At step 567, the information regarding the protective actions taken by the method 500 may be recorded in a computer-readable medium. As discussed above, the recording may include ordering the information and/or applying time stamp data to the information. The ordering and/or time stamp data may allow the protective actions to be correlated with the quantized analog stimulus data recorded at step 540.

At step 570, the method 500 may provide the information stored on the computer-readable storage medium to an operator or process (via an HMI). The information may be provided by a report generator (such as the report generator 246 of FIG. 2) and/or a metering module (such as the metering module 448 of FIG. 4). Accordingly, the method 500 may make available quantized analog stimulus measurements recorded over a particular time period (along with any protective actions taken responsive thereto). Alternatively, or in addition, the method 500 may make quantized analog stimulus measurements (and information regarding protective actions taken responsive to the measurements) available on a real-time basis (as the stimulus measurements are received and/or as the protective actions are taken). The information provided at step 570 may be used to test, validate, calibrate, and/or configure the method 500 as described above (e.g., identify detector issues, determine detector attenuation, establish arc flash detection levels or thresholds, determine ambient stimulus levels, and so on).

At step 580, the method 500 may analyze the information recorded at steps 540 and/or 565 to automatically detect potential problems in the method 500. As discussed above, detecting devices, such as EO radiation collectors, EO conductors, current transformers, and the like may be subject to gradual degradation (e.g., an EO conductor may be gradually abraded and/or moved out of position by vibration within switchgear housing, a current transformer may gradually break down, or the like). The analysis of step 580 may include determining detector attenuation based upon recorded quantized analog stimulus measurements. For example, if an EO radiation collector exhibits a gradual decline in ambient EO radiation levels over a particular timeframe, step 580 may determine that the EO radiation collector (or an EO conductor coupling the EO radiation collector to the method 500) may be subject to degradation. Similarly, if a current transformer exhibits inconsistent and/or variable nominal measurements (over a particular timeframe), the method 500 may identify a problem in the current transformer. Alternatively, or in addition, step 580 may include supplying stimulus to the method 500 and observing the result. For example, the stimulus received at step 520 may be of a known type and/or intensity (may be produced by the method 500). The intensity of the stimulus may be compared against the quantized analog measurements determined responsive thereto. An attenuation of the detector used to receive the stimulus may be determined by comparing the known intensity of stimulus provided to the method 500 against the quantized analog stimulus measurements actually received by the method 500.

At step 585, the method 500 make take one or more protective actions responsive to the analysis of step 580. The protective actions of step 585 may include issuing one or more alerts. Issuing an alert may include storing the alert on a computer-readable medium, displaying the alert on an HMI, transmitting the alert via a communication interface coupled to the method 500 (e.g., sent via email, SMS message, PSTN, etc.), or the like. The alert may include information to identifying one or more detectors that may be misoperating (according to the analysis of the quantized analog stimulus measurements of step 580). The information may further indicate the nature of the suspected misoperation and/or a suspected cause thereof (e.g., high levels of attenuation in an EO conductor, etc.). The protective action(s) taken at step 585 may be selected according to a severity of the detector problem determined at step 580. For example, in some embodiments, a protective action may include tripping a breaker, issuing alerts to other protective devices, or the like. Such actions may be taken upon determining that a particular detector (e.g., an EO radiation collector) is inoperable and, as such, the power system is unprotected.

At step 590, the method 500 may determine whether monitoring is to continue. If so, the flow may return to step 520 where stimulus measurements may be received; otherwise, the flow may terminate at step 595.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable storage media suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention.

What is claimed is:

1. An intelligent electronic device (IED), comprising:
a first input configured to receive measurements of electro-optical (EO) radiation acquired at an electrical power system;
a second input configured to receive measurements of a second type of stimulus acquired from the electrical power system; and
an arc flash detection unit configured to assert an arc flash detection signal in response to EO radiation measurements indicative of an arc flash event and measurements of the second type of stimulus indicative of an arc flash event by use of an overlight element configured to detect EO radiation indicative of an arc flash event by use of one or more of an inverse time-over-light metric and a cumulative stimulus metric;
wherein the arc flash detection unit is further configured to store EO radiation measurements indicative of nominal operating conditions of the electrical power system on a computer-readable storage medium.

2. The IED of claim 1, wherein the second input is configured to receive current measurements from the electrical power system, and wherein the arc flash detection unit is further configured to store current measurements indicative of nominal operating conditions of the electrical power system on the computer-readable storage medium.

3. The IED of claim 1, wherein the arc flash detection unit is further configured to store a record of assertion of the arc flash detection signal and EO radiation measurements corresponding to the assertion on the computer-readable storage medium.

4. The IED of claim 1, further comprising a timestamp module configured to timestamp the EO radiation measurements stored on the computer-readable storage medium.

5. The IED of claim 4, wherein the timestamp module is further configured to timestamp current measurements received via the second input, and wherein the arc flash detection unit is further configured to store time-stamped current measurements indicative of nominal operating conditions of the electrical power system on the computer-readable storage medium.

6. The IED of claim 4, wherein the arc flash detection unit is configured to store an assertion time of arc flash detection signal and time-stamped EO radiation measurements corresponding to the assertion of the arc flash detection signal on the computer-readable storage medium.

7. The IED of claim 1, further comprising a human-machine interface configured to display the stored EO radiation measurements indicative of nominal operating conditions of the electrical power system.

8. A method, comprising:
receiving electro-optical (EO) radiation measurements from a power system;
receiving current measurements from the power system;
providing for detecting an arc flash event in response to receiving EO radiation measurements indicative of an arc flash event and current measurements indicative of an arc flash event by use of an overlight element configured to detect EO radiation indicative of an arc flash event by use of one or more of an inverse time-over-light metric and a cumulative stimulus metric; and
storing EO radiation measurements indicative of non-arc flash operating conditions of the power system on a computer-readable storage medium.

9. The method of claim 8, wherein the EO radiation measurements are acquired by use of an EO radiation collector within a housing of the power system.

10. The method of claim 8, further comprising applying respective timestamps to the EO radiation measurements indicative of non-arc flash operating conditions of the power system.

11. The method of claim 8, further comprising:
applying respective timestamps to current measurements indicative of non-arc flash operating conditions of the power system; and
storing the time-stamped current measurements indicative of non-arc flash operating conditions of the power system on the computer-readable storage medium.

12. The method of claim 8, further comprising:
applying a timestamp to EO radiation measurements indicative of an arc flash event;
storing the time-stamped EO radiation measurements indicative of the arc flash event on the computer-readable storage medium; and
storing an indication of a detection time of the arc flash event on the computer-readable storage medium.

13. The method of claim 12, further comprising displaying the time-stamped EO radiation measurements and the detection time of the arc flash event.

14. The method of claim 12, further comprising:
applying a timestamp to current measurements indicative of the arc flash event; and
storing the time-stamped current measurements indicative of the arc flash event on the computer-readable storage medium.

15. A computer-readable storage medium comprising instructions, which, if executed by an intelligent electronic device (IED), cause the IED to perform a method, comprising:

receiving stimulus measurements from a power system, the stimulus measurements comprising current measurements and electro-optical (EO) radiation measurements;

time stamping the stimulus measurements;

detecting an arc flash event in response to one or more of EO radiation stimulus satisfying an inverse time-over-stimulus metric and EO radiation stimulus satisfying a cumulative stimulus metric;

providing for invoking a protective function of the power system in response to detecting an arc flash event by use of the time-stamped stimulus measurements;

recording time-stamped stimulus measurements corresponding to detection of the arc flash event on a computer-readable storage medium;

recording an indication of a detection time of the arc flash event on the computer-readable storage medium; and recording time-stamped stimulus measurements indicative of normal operations of the power system on the computer-readable storage medium.

16. The computer-readable storage medium of claim 15, wherein providing for invoking the protective function of the power system comprises asserting an arc flash detection signal.

17. The computer-readable storage medium of claim 15, the method further comprising providing for one or more of displaying the time-stamped stimulus measurements indicative of normal operations of the power system and exporting the time-stamped stimulus measurements indicative of normal operations of the power system.

18. The computer-readable storage medium of claim 15, the method further comprising providing for one or more of displaying the time-stamped stimulus measurements corresponding to detection of the arc flash event and exporting the time-stamped stimulus measurements corresponding to detection of the arc flash event.

* * * * *